United States Patent [19]

Koya

[11] Patent Number: 5,066,874
[45] Date of Patent: Nov. 19, 1991

[54] SIGNAL OUTPUT CIRCUIT HAVING BIPOLAR TRANSISTOR IN OUTPUT STAGE AND ARRANGED IN CMOS SEMICONDUCTOR INTEGRATED CIRCUIT

[75] Inventor: Kiichi Koya, Yokohama, Japan

[73] Assignee: Kabushiki Kaisha Toshiba, Kawasaki, Japan

[21] Appl. No.: 612,458

[22] Filed: Nov. 14, 1990

[30] Foreign Application Priority Data

Nov. 15, 1989 [JP] Japan .................................. 1-296567

[51] Int. Cl.⁵ ........................................... H03K 19/01
[52] U.S. Cl. ................................... 307/446; 307/443; 307/570
[58] Field of Search ............... 307/443, 446, 456, 475, 307/499, 500, 570

[56] References Cited

U.S. PATENT DOCUMENTS

| | | | |
|---|---|---|---|
| 4,471,239 | 9/1984 | Ohba | 307/456 |
| 4,678,940 | 7/1987 | Vasseghi et al. | 307/570 X |
| 4,961,011 | 10/1990 | Ide et al. | 307/446 |
| 4,999,523 | 3/1991 | Cham et al. | 307/443 X |
| 5,027,009 | 6/1991 | Urakawa et al. | 307/446 |

FOREIGN PATENT DOCUMENTS

| | | |
|---|---|---|
| 0055570 | 7/1982 | European Pat. Off. . |
| 0058958 | 9/1982 | European Pat. Off. . |
| 0172350 | 2/1986 | European Pat. Off. . |
| 0320582 | 6/1989 | European Pat. Off. . |

Primary Examiner—David Hudspeth
Attorney, Agent, or Firm—Finnegan, Henderson, Farabow, Garrett, and Dunner

[57] ABSTRACT

A signal from an input terminal is supplied to a CMOS inverter. An output from the inverter is supplied to the bases of a pnp bipolar transistor and an npn bipolar transistor. The base of an output pnp bipolar transistor is connected to the emitter of one bipolar transistor through a resistor for setting a base current. The base of an output npn bipolar transistor is connected to the emitter of the other bipolar transistor through a resistor for setting a base current. The emitter of one output bipolar transistor is connected to a node for receiving a high-potential power supply voltage, and its collector is connected to an output terminal. The emitter of the other output bipolar transistor is connected to a node for receiving a low potential power supply voltage and its collector is connected to the output terminal.

7 Claims, 3 Drawing Sheets

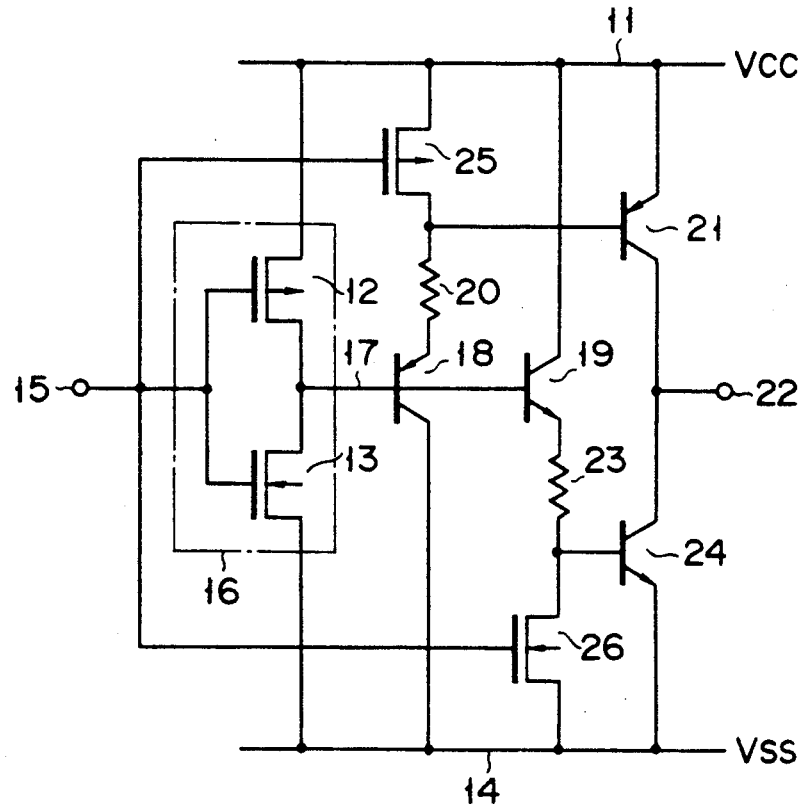
F I G. 2

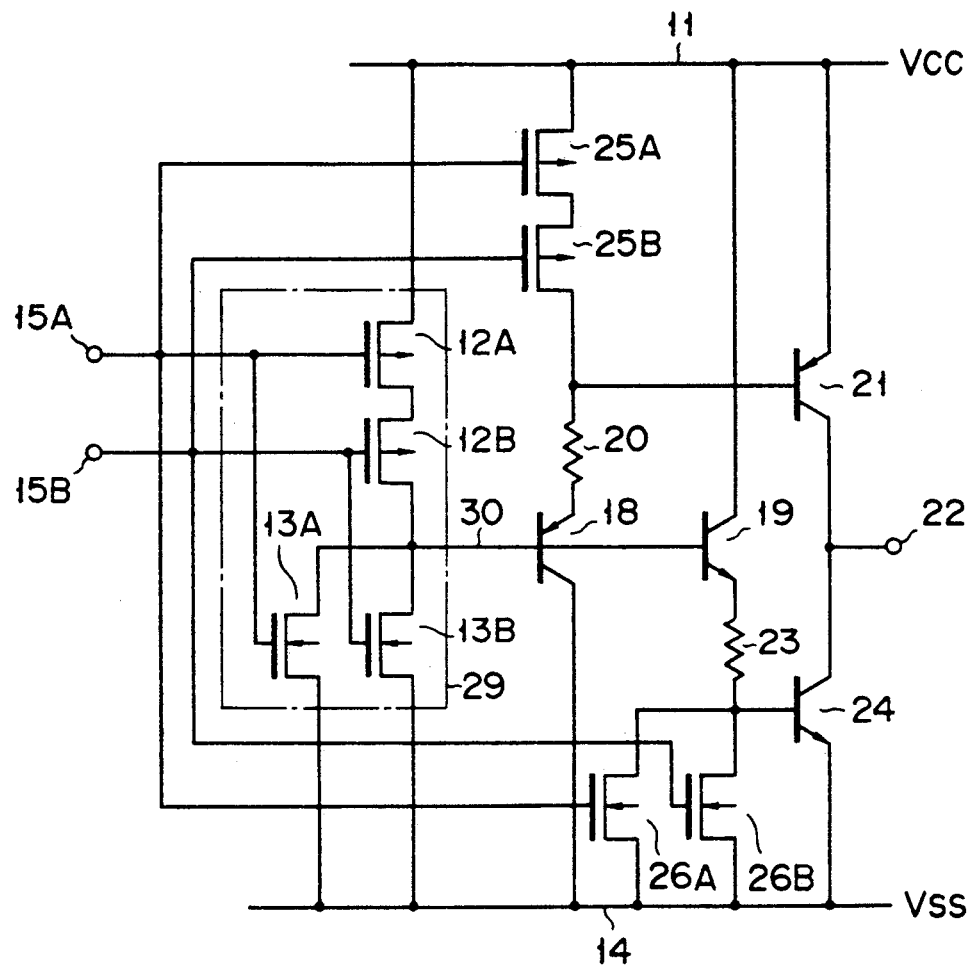
F I G. 4

SIGNAL OUTPUT CIRCUIT HAVING BIPOLAR TRANSISTOR IN OUTPUT STAGE AND ARRANGED IN CMOS SEMICONDUCTOR INTEGRATED CIRCUIT

BACKGROUND OF THE INVENTION

1. Field of the Invention

The present invention relates to a signal output circuit arranged in a CMOS digital semiconductor integrated circuit and, more particularly, to a signal output circuit having a bipolar transistor in an output stage.

2. Description of the Related Art

In a digital semiconductor integrated circuit, when a load is driven by a large current, a signal output circuit having a Bi-CMOS (bipolar-complimentary MOS) arrangement is used.

FIG. 1 shows an example of a conventional Bi-CMOS signal output circuit. In the signal output circuit, reference numerals 31 and 32 denote p- or n-channel MOS transistors, the gates of which are commonly connected to an input terminal 33, and which perform switching operations in response to a signal from the input terminal 33; 34 and 35, pnp or npn bipolar transistors; 36 and 37, resistors for setting a base current; 38 and 39, pnp or npn output bipolar transistors, the collectors of which are commonly connected to an output terminal 40; and 41 and 42, resistors for absorbing excess base charges of the bipolar transistors 38 and 39.

An operation of the circuit will be described in brief. When a signal at the input terminal 33 is "H" level, the p-channel MOS transistor 31 is turned off, and the n-channel MOS transistor 32 is turned on. At this time, a base current is flowed into the pnp bipolar transistor 38 through the bipolar transistor 34 and the resistor 37, so that the transistor 38 is turned on, and the output terminal 40 is charged with a high-potential power supply voltage VCC. On the other hand, when the signal at the input terminal 33 is "L" level, the p-channel MOS transistor 31 is turned on, and the n-channel MOS transistor 32 is turned off. At this time, a predetermined value of the base current is flowed into the npn bipolar transistor 39 through the resistor 36 and the bipolar transistor 35, so that the transistor 39 is turned on, and the output terminal 40 is discharged to a low-potential power supply voltage VSS.

After supply of the base current to the transistor 38 is stopped, an excess base charge is absorbed by a node of the power supply voltage VCC through the resistor 41. On the other hand, after supply of the base current to the transistor 39 is stopped, an excess base charge is absorbed by a node of the power supply voltage VSS through the resistor 42. Therefore, a high-speed switching operation performed when the transistor 38 and 39 are turned off can be achieved.

In the above-described conventional circuit, in a case that a 2-mA output current is to be obtained from the output terminal 40 when a value of the high-potential power supply voltage VCC is 5 V, a resistance R of the resistor 36 is determined by the following equation, assuming that a current amplification factor hfe(Q39) of the bipolar transistor 39 is, e.g., 5 (since the transistor 39 is operated in a saturation region when it is in an ON state, the current amplification factor at this time is decreased as compared with the operation in a non-suturation region), and a current amplification hfe(Q35) of the bipolar transistor 35 is, e.g., 100 wherein Vf in the following equation is a base-emitter voltage of the npn or pnp bipolar transistor.

$$R = \frac{VCC - 2Vf}{\frac{\text{output current}}{hfe(Q39) \times hfe(Q35)}} = \frac{5 - .14}{\frac{2 \times 10^{-3}}{5 \times 100}} = 900\ k\Omega$$

As a result, the resistance of the resistor 36 becomes extremely large. Similarly, the resistance of the resistor 37 becomes extremely large. Note that the resistors 41 and 42 for absorbing base charges are normally set in values from 5 k$\Omega$ to 10 k$\Omega$.

In the above-described signal output circuit, the resistances of the resistors 36 and 37 are extremely large, so that charge and discharge rates of parasitic capacitors of the bases of the transistors 34 and 35 are low. As a result, switching speeds of the output bipolar transistors 38 and 39 are decreased, so the output switching speed is decreased.

In addition, in the conventional circuit, the base charges of the output transistors 38 and 39 are absorbed by the resistors 41 and 42. As a result, when the output transistors 38 and 39 are turned on, wasteful currents not used as base currents are flowed into the resistors 41 and 42. Therefore, the base currents of the output transistors 38 and 39 are decreased by the wasteful currents, so that the turn-on speed of the output transistors is decreased, thereby further decreasing the output switching speed.

SUMMARY OF THE INVENTION

It is, therefore, an object of the present invention to provide a signal output circuit capable of increasing an output switching speed.

According to the present invention, there is provided a signal output circuit comprising at least one input terminal, an output terminal, first and second nodes for respectively receiving power supply voltages having different values, a CMOS logic gate for generating an output corresponding to the input, a first bipolar transistor of a first polarity having the base for receiving the output from the logic gate, a second bipolar transistor of a second polarity having the base for receiving the output from the logic gate, a first resistor having one terminal connected to the emitter of the first bipolar transistor, a second resistor having one terminal connected to the emitter of the second bipolar transistor, a third bipolar transistor of the first polarity having the emitter connected to the first node, the collector connected to the output terminal, and the base connected to the other terminal of the first resistor, and a fourth bipolar transistor of the second polarity having the emitter connected to the second node, the collector connected to the output terminal, and the base connected to the other terminal of the second resistor.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 2 is a circuit diagram of the first embodiment of the present invention;

FIG. 4 is a circuit diagram of the third embodiment of the present invention.

DETAILED DESCRIPTION OF THE PREFERRED EMBODIMENTS

Figure 1:
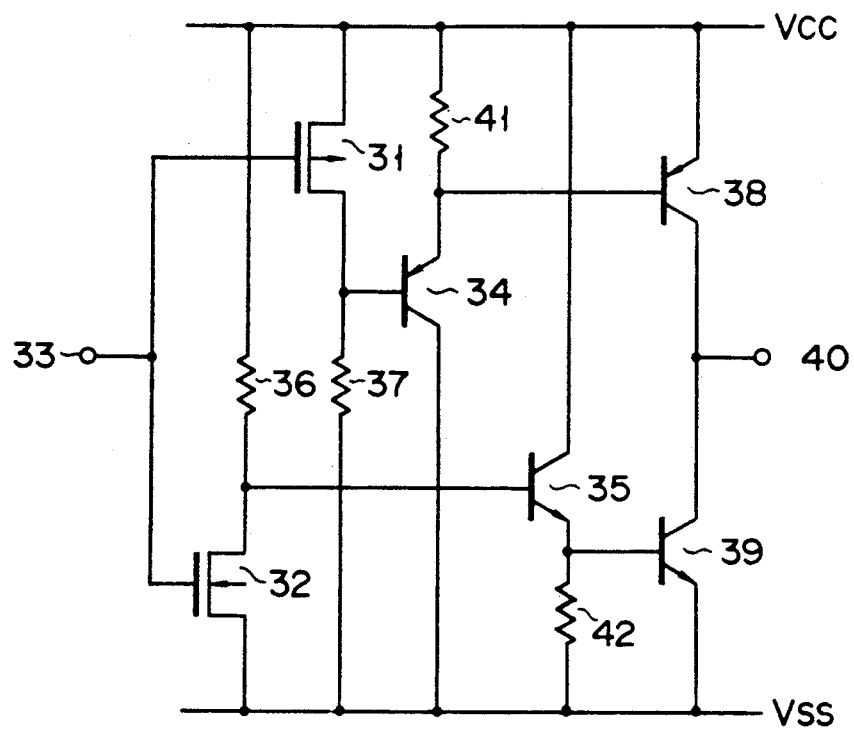
FIG. 1 is a circuit diagram of a conventional signal output circuit.

The present invention will be described in detail hereinafter with reference to embodiments in conjunction with the accompanying drawings.

FIG. 2 shows an arrangement of the first embodiment of a signal output circuit according to the present invention.

Referring to FIG. 2, the source of a p-channel MOS transistor 12 is connected to a node 11 for receiving a power supply voltage VCC of 5 V. The drain of an n-channel MOS transistor 13 is connected to the drain of the MOS transistor 12. The source of the MOS transistor 13 is connected to a node 14 for receiving a power supply voltage VSS of 0 V. The gates of the MOS transistors 12 and 13 are commonly connected to an input terminal 15, and the MOS transistors 12 and 13 constitute a CMOS inverter 16.

The bases of a pnp bipolar transistor 18 and an npn bipolar transistor 19 are connected to an output node 17 which is a common connection point of the drains of the MOS transistors 12 and 13 in the inverter 16. The collector of one bipolar transistor 18 is connected to the node 14, and one terminal of a resistor 20 for setting a base current is connected to the emitter of the transistor 18. The base of an output pnp bipolar transistor 21 is connected to the other terminal of the resistor 20. The emitter of the bipolar transistor 21 is connected to the node 11, and the collector of the transistor 21 is connected to an output terminal 22.

The collector of the other bipolar transistor 19 is connected to the node 11, and one terminal of a resistor 23 for setting a base current is connected to the emitter of the transistor 19. The base of an output npn bipolar transistor 24 is connected to the other terminal of the resistor 23. The collector and emitter of the bipolar transistor 24 are respectively connected to the output terminal 22 and the node 14.

The source of a p-channel MOS transistor 25 for absorbing a base charge of the bipolar transistor 21 is connected to the node 11 of the power supply voltage VCC. The drain and gate of the MOS transistor 25 are respectively connected to the base of the bipolar transistor 21 and the input terminal 15. The source of an n-channel MOS transistor 26 for absorbing a base charge of the bipolar transistor 24 is connected to the node 14 of the power supply voltage VSS. The drain and gate of the MOS transistor 26 are respectively connected to the base of the bipolar transistor 24 and the input terminal 15.

In the signal output circuit having the above-described arrangement, when the signal at the input terminal 15 is "H" level, the n-channel MOS transistor 13 in the inverter 16 is in an ON state, and the output node 17 of the transistor 13 is "L" level. At this time, the pnp bipolar transistor 18 is in an ON state, and the base current is flowed into the output pnp bipolar transistor 21 through the resistor 20 and the transistor 18. As a result, the bipolar transistor 21 is turned on and the output terminal 22 is charged with the power supply voltage VCC to be "H" level.

In this state, when the signal at the input terminal 15 is inverted into "L" level, the p-channel MOS transistor 12 in the inverter 16 is turned on, and the output node 17 is charged with the power supply voltage VCC to be "H" level. At this time, the pnp bipolar transistor 18 is turned off, and the npn bipolar transistor 19 is turned on. Since the base current is flowed into the output npn bipolar transistor 24 through the transistor 19 and the resistor 23, the bipolar transistor 24 is turned on, and the output terminal 22 is discharged to the power supply voltage VSS. As a result, the signal at the output terminal 22 is inverted from "H" level to "L" level.

In addition, after the bipolar transistor 18 is turned off and supply of the base current into the transistor 21 is stopped, the input signal changes from "H" level to "L" level, and the p-channel MOS transistor 25 is in an ON state. As a result, supply of the base current is stopped, and the charge accumulated at the base of the bipolar transistor 21 to be turned off is absorbed by the node 11 of the power supply voltage VCC through the MOS transistor 25. Therefore, the bipolar transistor 21 is abruptly turned off.

When the signal at the input terminal 15 is inverted again into "H" level, the n-channel MOS transistor 13 in the inverter 16 is turned on, the bipolar transistor 18 is turned on, and the bipolar transistor 21 is turned on. As a result, the signal at the output terminal 22 becomes "H" level as described above.

In this case, after the bipolar transistor 19 is turned off and supply of the base current to the transistor 24 is stopped, the charge accumulated at the base of the bipolar transistor 24 to be turned off is absorbed by the node 14 of the power supply voltage VSS through the n-channel MOS transistor 26 in an ON state. As a result, the bipolar transistor 24 is abruptly turned off.

In the above-described embodiment, in a case that a 2-mA output current is to be obtained from the output terminal 22 when the high-potential power supply voltage VCC is 5 V as in the conventional circuit, a resistance R of the resistors 20 and 23 is determined by the following equation, assuming that current amplification factors hfe (Q21) and hfe (Q24) of the bipolar transistors 21 and 24 are respectively 5, wherein Vf in the following equation is a base-emitter voltage of the npn or pnp bipolar transistor.

$$R = \frac{VCC - 2Vf}{\frac{\text{output current}}{hfe(Q21)}} = \frac{5 - 1.4}{\frac{2 \times 10^{-3}}{5}} = 9\,K\Omega \qquad 2$$

That is, the resistance of the resistors 20 and 23 becomes as low as 1/100 that in the conventional circuit, so that charge and discharge operations of parasitic capacitors of the bases of the bipolar transistors 21 and 24 can be performed at a higher speed than that in the conventional circuit. As a result, switching speeds of the output bipolar transistors 21 and 24 are increased, resulting in an increase in output switching speed.

In addition, in the above-described embodiment, the excess base charges of the output transistors 21 and 24 are absorbed by the MOS transistors 25 and 26. For this reason, when one of the output transistors 21 and 24 is in an ON state, one of the base charge absorbing MOS transistors 25 and 26 in an ON state is turned off, so that a wasteful current is not flowed upon turn-on operation of the output transistor, unlike in the conventional circuit. As a result, the base current can be larger than that in the conventional circuit. Therefore, the turn-on speed of the output transistor is increased, thereby increasing the output switching speed.

Figure 3:
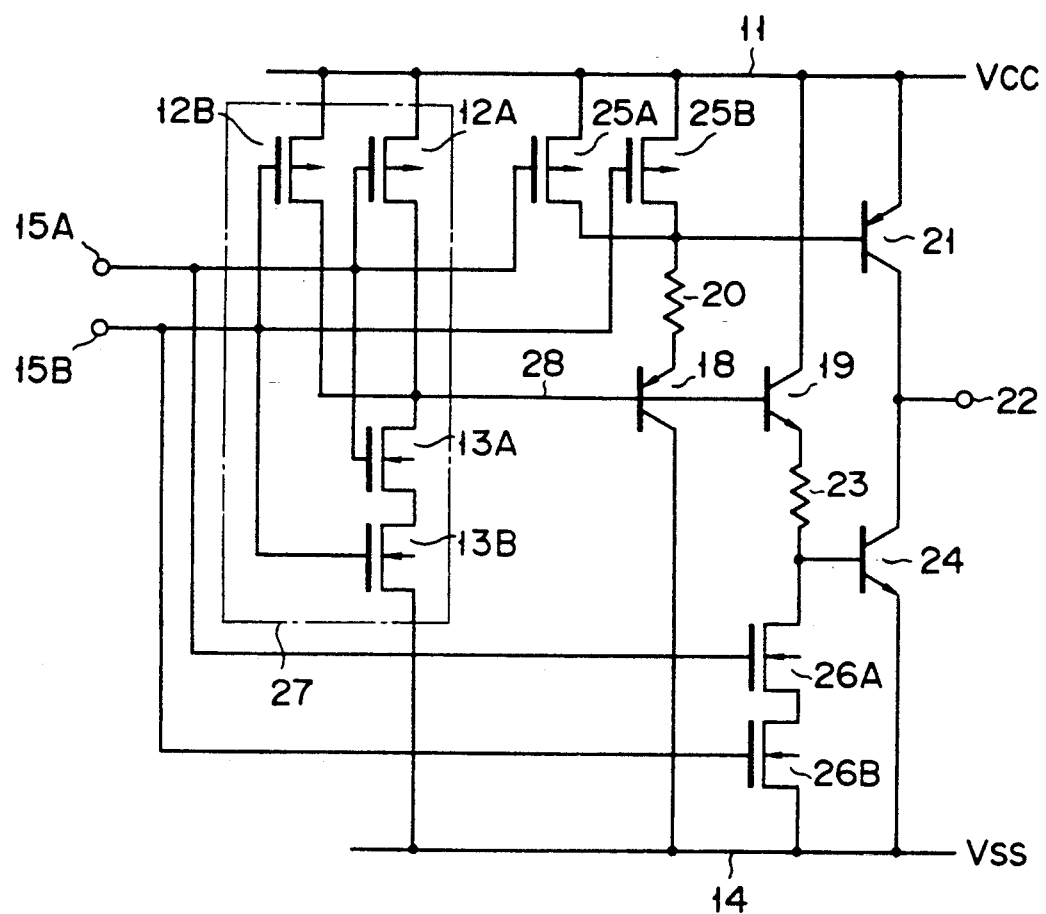
FIG. 3 is a circuit diagram of the second embodiment of the present invention.

The second embodiment of the present invention will be described with reference to FIG. 3. In this circuit, two input terminals 15A and 15B are arranged. A two-input NAND gate 27 constituted by two p-channel MOS transistors 12A and 12B and two n-channel MOS transistors 13A and 13B is arranged in place of the CMOS inverter 16 in the first embodiment shown in FIG. 2. More specifically, the sources of the p-channel MOS transistors 12A and 12B are commonly connected to a node 11 of a power supply voltage VCC, and the drains of the p-channel transistors 12A and 12B are commonly connected to an output node 28 of the NAND gate 27. The source-drain paths of the n-channel MOS transistors 13A and 13B are connected in series between a node 14 of a power supply voltage VSS and the output node 28. The gates of one p-channel MOS transistor 12A and one n-channel MOS transistor 13A are connected to one input terminal 15A, and the gates of the other p-channel MOS transistor 12B and the other n-channel MOS transistor 13B are connected to the other input terminal 15B.

In this embodiment, since the two-input NAND gate 27 is arranged in place of the inverter 16, the source-drain paths of two p-channel MOS transistors 25A and 25B are connected in parallel between the node 11 of the power supply voltage VCC and the base of a pnp bipolar transistor 21, and the source-drain paths of two n-channel MOS transistors 26A and 26B are connected in series between the node 14 of the power supply voltage VSS and the base of an npn bipolar transistor 24. The gates of the MOS transistors 25A and 26A are commonly connected to one input terminal 15A, and the gates of the MOS transistors 25B and 26B are commonly connected to the other input terminal 15B.

In the signal output circuit with this arrangement, a signal of a level corresponding to signals supplied to the input terminals 15A and 15B is obtained from an output terminal 22. More specifically, when two input signals are "H" level, the output node 28 of the NAND gate 27 becomes "L" level, bipolar transistors 18 and 21 are respectively turned on, and an "H" level signal is output from the output terminal 22. When one of the two input signals is "L" level, the output node 28 of the NAND gate 27 becomes "H" level, bipolar transistors 19 and 24 are turned on, and a signal of "L" level is output from the output terminal 22.

In this embodiment, with the arrangement of the bipolar transistors 18 and 19, the resistances of resistors 20 and 23 can be greatly decreased as compared with the conventional circuit, resulting in an increase in output switching speed.

The third embodiment of the present invention will be described with reference to FIG. 4. This circuit has two input terminals 15A and 15B as in the second embodiment, and a two-input NOR gate 29 constituted by two p-channel MOS transistors 12A and 12B and two n-channel MOS transistors 13A and 13B is arranged in place of the CMOS inverter 16 shown in FIG. 2.

More specifically, the source-drain paths of the p-channel MOS transistors 12A and 12B are connected in series between a node 11 of a power supply voltage VCC and an output node 30 of the NOR gate 29. The sources of the n-channel MOS transistors 13A and 13B are commonly connected to a node 14 of a power supply voltage VSS, and the drains of the n-channel MOS transistors 13A and 13B are commonly connected to the output node 30. The gates of one p-channel MOS transistor 12A and one n-channel MOS transistor 13A are connected to one input terminal 15A. The gates of the other p-channel MOS transistor 12B and the other n-channel MOS transistor 13B are connected to the other input terminal 15B.

In this embodiment, since the two-input NOR gate 29 is arranged in place of the inverter 16, the source-drain paths of two p-channel MOS transistors 25A and 25B are connected in series between the node 11 of the power supply voltage VCC and the base of a pnp bipolar transistor 21. The source-drain paths of two n-channel MOS transistors 26A and 26B are connected in parallel between the node 14 of the power supply voltage VSS and an npn bipolar transistor 24. The gates of the MOS transistors 25A and 26A are commonly connected to one input terminal 15A and the gates of the MOS transistors 25B and 26B are commonly connected to the other input terminal 15B.

In the signal output circuit with this arrangement, a signal of a level corresponding to signals supplied to the input terminals 15A and 15B is obtained from an output terminal 22. More specifically, when the two input signals are "L" level, the signal at the output node 30 in the NOR gate 29 becomes "H" level, bipolar transistors 19 and 24 are turned on, and a signal of "L" level is output from the output terminal 22. When one of the two input signals is "H" level, a signal of the output node 30 of the NOR gate 29 becomes "L" level, bipolar transistors 18 and 21 are turned on, and a signal of "H" level is output from the output terminal 22.

In this embodiment, by the bipolar transistors 18 and 19, the resistances of resistors 20 and 23 can be greatly decreased as compared with the conventional circuit, and the output switching speed can be increased.

As has been described above, according to the present invention, a resistance of a resistor for setting a base current of an output transistor can be greatly decreased as compared with the conventional circuit, so that the parasitic capacitor can be charged upon switching at a relatively high speed. In addition, the excess base charge of the output transistor is absorbed by a MOS transistor, so that a higher switching speed upon turn-off operation of the output transistor can be obtained. Therefore, according to a signal output circuit of the present invention, high input/output transfer characteristics can be obtained.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A signal output circuit comprising:
   at least one input terminal;
   an output terminal;
   first and second nodes for respectively receiving power supply voltages having different values;
   a CMOS logic gate for receiving a signal from said input terminal and for generating an output corresponding to the input;
   a first bipolar transistor of a first polarity having a base for receiving the output from said logic gate;
   a second bipolar transistor of a second polarity having a base for receiving the output from said logic gate;
   a first resistor having one terminal connected to an emitter of said first bipolar transistor;
   a second resistor having one terminal connected to an emitter of said second bipolar transistor;
   a third bipolar transistor of the first polarity having an emitter connected to said first node, a collector connected to said output terminal, and a base connected to the other terminal of said first resistor; and
   a fourth bipolar transistor of the second polarity having an emitter connected to said second node, a collector connected to said output terminal, and a base connected to the other terminal of said second resistor.

2. A circuit according to claim 1, further comprising:
   at least one first MOS transistor of the first polarity, a source-drain path of which is connected between said first node and the base of said third bipolar transistor, and a gate of which receives a signal from said input terminal; and
   at least one second MOS transistor of the second polarity, a source-drain path of which is connected between said second node and the base of said fourth bipolar transistor, and a gate of which receives the signal from said input terminal.

3. A circuit according to claim 1, wherein said logic gate is a CMOS inverter.

4. A circuit according to claim 1, wherein said logic gate is a CMOS NAND gate.

5. A circuit according to claim 1, wherein said logic gate is a CMOS NOR gate.

6. A signal output circuit comprising:
   an input terminal;
   an output terminal;
   a first node for receiving a high-potential power supply voltage;
   a second node for receiving a low-potential power supply voltage;
   a CMOS inverter for receiving a signal from said input terminal and inverting the input;
   a pnp first bipolar transistor having a base for receiving an output from said inverter;
   an npn second bipolar transistor having a base for receiving an output from said inverter;
   a first resistor having one terminal connected to an emitter of said first bipolar transistor;
   a second resistor having one terminal connected to an emitter of said second bipolar transistor;
   a pnp third bipolar transistor having an emitter connected to said first node, a collector connected to said output terminal, and a base connected to the other terminal of said first resistor;
   an npn fourth bipolar transistor having an emitter connected to said second node, a collector connected to said output terminal, and a base connected to the other terminal of said second resistor;
   a p-channel type first MOS transistor having a source connected to said first node, a drain connected to said base of said third bipolar transistor, and a gate for receiving a signal from said input terminal; and
   an n-channel type second MOS transistor having a source connected to said second node, a drain connected to said base of said fourth bipolar transistor, and a gate for receiving the signal from said input terminal.

7. A signal output circuit comprising:
   a plurality of input terminals;
   an output terminal;
   first and second nodes for receiving power supply voltages having different values;
   a CMOS multi-input logic gate for receiving signals from said plurality of input terminals and for generating an output corresponding to the inputs;
   a first bipolar transistor of a first polarity having a base for receiving the output from said multi-input logic gate;
   a second bipolar transistor of a second polarity having a base for receiving the output from said multi-input logic gate;
   a first resistor having one terminal connected to an emitter of said first bipolar transistor;
   a second resistor having one terminal connected to an emitter of said second bipolar transistor;
   a third bipolar transistor of the first polarity having an emitter connected to said first node, a collector connected to said output terminal, and a base connected to the other terminal of said first resistor;
   a fourth bipolar transistor of the second polarity having an emitter connected to said second node, a collector connected to said output node, and a base connected to the other terminal of said second resistor;
   a plurality of MOS transistors of the first polarity having sources connected to said first node, drains connected to said base of said third bipolar transistor, and gates for respectively receiving signals from said plurality of input terminals; and
   a plurality of MOS transistor of the second polarity having source-drain paths connected in series between said second node and said base of said fourth bipolar transistor, and gates for respectively receiving the signals from said plurality of input terminals.

* * * * *